United States Patent
Wang et al.

(10) Patent No.: US 9,032,270 B2
(45) Date of Patent: May 12, 2015

(54) DEVICE AND METHOD FOR STORING ENCODED AND/OR DECODED CODES BY RE-USING ENCODER

(75) Inventors: Yiqi Wang, Beijing (CN); Zhengsheng Han, Beijing (CN)

(73) Assignee: Institute of Microelectronics, Chinese Academy of Sciences, Beijing (CN)

(*) Notice: Subject to any disclaimer, the term of this patent is extended or adjusted under 35 U.S.C. 154(b) by 108 days.

(21) Appl. No.: 14/004,100

(22) PCT Filed: Sep. 21, 2011

(86) PCT No.: PCT/CN2011/079912
§ 371 (c)(1),
(2), (4) Date: Sep. 9, 2013

(87) PCT Pub. No.: WO2012/119447
PCT Pub. Date: Sep. 13, 2012

(65) Prior Publication Data
US 2013/0346828 A1    Dec. 26, 2013

(30) Foreign Application Priority Data
Mar. 10, 2011    (CN) .......................... 2011 1 0058198

(51) Int. Cl.
| | | |
|---|---|---|
| G06F 11/10 | (2006.01) |
| G11B 20/18 | (2006.01) |
| G11C 7/10 | (2006.01) |
| H03M 13/13 | (2006.01) |
| H03M 13/37 | (2006.01) |
| G11C 29/52 | (2006.01) |
| G11C 29/04 | (2006.01) |

(52) U.S. Cl.
CPC ............ *G06F 11/10* (2013.01); *G06F 11/1008* (2013.01); *G11B 20/1833* (2013.01); *G11C 7/1006* (2013.01); *H03M 13/13* (2013.01); *H03M 13/3776* (2013.01); *G06F 11/1012* (2013.01); *G11C 29/52* (2013.01); *G11C 2029/0411* (2013.01)

(58) Field of Classification Search
CPC .. H03M 13/3776; H03M 13/13; G11C 29/52; G11C 7/1006; G11C 2029/0411; G06F 11/10; G06F 11/1008; G06F 11/1012; G11B 20/18; G11B 20/1813; G11B 20/1833
See application file for complete search history.

(56) References Cited

U.S. PATENT DOCUMENTS

| | | | | |
|---|---|---|---|---|
| 4,072,853 A | * | 2/1978 | Barlow et al. ................. | 714/758 |
| 2011/0004807 A1 | | 1/2011 | Smith et al. | |
| 2012/0278688 A1 | * | 11/2012 | Tsukamoto et al. .......... | 714/799 |

FOREIGN PATENT DOCUMENTS

CN        101211667 A        7/2008

OTHER PUBLICATIONS

"A Class of Optimal Minimum Odd-Weight-Column SEC-DED Codes", M.Y. Hsiao, Jul. 1970.
(Continued)

*Primary Examiner* — John P Trimmings
(74) *Attorney, Agent, or Firm* — Kinney & Lange, P.A.

(57) ABSTRACT

The present disclosure provides a device and method for storing encoded and/or decoded codes by re-using an encoder. The device and method for storing the encoded and/or decoded codes according to the present disclosure enables re-use of the encoder during a decoding process, which makes it unnecessary to use additional hardware and thereby reduces an area consumed by an EDAC (error detection and correction) decoder.

10 Claims, 4 Drawing Sheets

(56) References Cited

OTHER PUBLICATIONS

"Design and Realization of Error Detection and Correction Circuit in S698M SoC", Lin Huang, http://www.cicmag.com.
"Error-Control Coding in Computers", Eiji Fujiwara, pp. 63-72, 0018/9162/90/0700-0063S01.00, IEEE Jul. 1990.
Thesis, "Research and Implementation of Key Techniques of High Reliable Microprocessor Designs", Chen Wei, May 2006.
English Translation of Office Action dated Aug. 2, 2013 for CN200910225252.
English Translation of Office Action dated Jun. 21, 2013 for JP2012-537281.
International Search Report, PCT/CN2011/079912.

* cited by examiner

DEVICE AND METHOD FOR STORING ENCODED AND/OR DECODED CODES BY RE-USING ENCODER

TECHNICAL FIELD

The present disclosure relates to semiconductor memory technology, and particularly to a device and method for storing encoded and/or decoded codes by re-using an encoder.

BACKGROUND

With continuous advancement of space technology and expansion of human's activity, various space exploration projects have been proposed for exploitation of outer space. In the outer space, large-scale integrated circuits are often disturbed by complex electromagnetic environment and thus may not function properly. For example, devices such as RAM, which stores data in bi-stability, may be upset under strong disturbance, altering a stored '0' to '1', or vice versa. This phenomenon is called Single Event Upset (SEU). The SEU may cause serious consequences such as failure of control programs or errors of important data. As integration level of chips increases, possibility of such errors also increases.

Initially, it was proposed to improve anti-SEU ability of a memory by increasing capacitance and impedance of a storage node because the larger capacitance and impedance may result in a longer RC delay in the node's hopping to an upset voltage level. Typically the SEU may only generate a transient large current, which lasts a short period insufficient for the storage node to hop to the upset voltage level. However, this solution has an inherent drawback in that the longer RC delay also results in longer time for writing data. Moreover, the storage node having the larger capacitance and impedance may consume larger area, in addition to causing increased capacitance of bit lines and a longer access time.

It was also proposed to improve the anti-SEU ability of the memory by adding redundant storage nodes. For example, a storage cell may comprise a plurality of storage nodes, e.g., seven, eight, or twelve storage nodes. However, this solution also has drawbacks similar to those described above such as the long writing time, the increased capacitance of the bit lines, and the long access time.

Recently, there is an attempt to improve anti-SEU ability of the memory in a system logic level, in which erroneous data caused by the SEU is corrected by an error detection and correction (EDAC) circuit. A tri-state voting circuit has been used for logic judgment in a device for storing encoded, and/or decoded codes. However, this will consume three times of area. Moreover, the circuit becomes complex and consumes more power, which is disadvantageous for a large-scale storage circuit.

SUMMARY

In view of the above-described problems in the art, the present disclosure provides a device and method for storing encoded and/or decoded codes by re-using an encoder to reduce circuit complexity, area, and power consumption.

According to an aspect of the present disclosure, there is provided a device for storing encoded and/or decoded codes by re-using an encoder. The device comprises an error detection and correction (EDAC) encoder, a memory, and an EDAC decoder. In an encoding process, the EDAC encoder is configured to encode N-bit information data received at its input and output M-bit check data, wherein M<N, and the memory is connected with the EDAC encoder and configured to store the N-bit information data and the M-bit check data. In a decoding process, the EDAC encoder is configured to encode the N-bit information data retrieved from the memory and output M-bit check data, and the EDAC decoder is connected with the memory and the EDAC encoder and configured to conduct error correction on the N-bit information data retrieved from the memory based on the M-bit check data output from the EDAC encoder and the M-bit check data retrieved from the memory and output error-corrected N-bit information data.

Optionally, the device may also include a path controller connected with the EDAC encoder, the memory, and the EDAC decoder. In the encoding process, the path controller switches on a data stream path from the EDAC encoder to the memory and switches off a data stream path from the memory to the EDAC encoder and a data stream path from the memory to the EDAC decoder. In the decoding process, the path controller switches on the data stream path from the memory to the EDAC encoder and the data stream path from the memory to the EDAC decoder and switches off the data stream path from the EDAC encoder to the memory.

Optionally, the memory may be an 8-bit memory or a 32-bit memory, wherein: N=8 and M=4 when the memory is the 8-bit memory; and N=32 and M=7 when the memory is the 32-bit memory.

Optionally, when the memory is the 32-bit memory, the EDAC encoder may be configured to encode 32-bit information data using an encoding/decoding check matrix of HSIAO coding and output 7-bit check data The EDAC decoder may be configured to conduct error correction on the 32-bit information data retrieved from the memory based on the 7-bit check data output from the EDAC decoder and the 7-bit check data retrieved from the memory using the encoding/decoding check matrix of the HSIAO coding.

Optionally, the EDAC encoder may comprise five 14-input XORs and two 13-input XORs. Each of the XORs may be configured to receive and conduct an XOR operation on preset bits of the 32-bit information data and output 1-bit check data.

Optionally, the EDAC decoder may comprise seven 2-input XORs, thirty-two 7-input ANDs, and thirty-two 2-input XORs. The seven 2-input XORs may be configured to conduct XOR operations on the 7-bit check data retrieved from the memory and the corresponding 7-bit check data output from the EDAC decoder, respectively, and output a 7-bit primary error-correction signal and an inverse signal thereof. The thirty-two 7-input ANDs may be connected with the seven 2-input XORs and configured to conduct thirty-two AND operations on the 7-bit primary error-correction signal and the inverse signal thereof, respectively, to generate thirty-two secondary error-correction signals. The thirty-two 2-input XORs may be connected with the thirty-two 7-input ANDs and configured to perform error detection and correction on the 32-bit information data retrieved from the memory by conducting XOR operations on the thirty-two secondary error-correction signals and the 32-bit information data retrieved from the memory and output 32-bit error-corrected information data.

According to another aspect of the present disclosure, there is provided a method applied to the device for storing the encoded and/or decoded codes by re-using the encoder. The method comprises, in the encoding process: encoding, by the EDAC encoder, the N-bit information data received at its input and outputting the M-bit check data, wherein M<N; and storing the N-bit information data and the M-bit check data in the memory connected with the EDAC encoder. The method further comprises, in the decoding process: encoding, by the EDAC encoder, the N-bit information data retrieved from the memory and outputting M-bit check data; and conducting, by the EDAC decoder, the error correction on the N-bit information data retrieved from the memory based on the M-bit check data output from the EDAC encoder and the M-bit check data retrieved from the memory and outputting the error-corrected N-bit information data.

According to the device and method of the present disclosure, the encoder can be re-used during the decoding process, which makes it unnecessary to use additional hardware, thus substantially reducing the area of the decoder.

According to the device and method of the present disclosure, anti-SEU ability of the memory can be effectively improved by employing one-bit error-correction and two-bit error-detection. When a single bit in a byte is upset, the error can be detected and corrected. When two bits in the byte are upset, the error can be detected and partly corrected.

DETAILED DESCRIPTION

Next, the present disclosure will be explained in detail in connection with specific embodiments with references to accompanied drawings, such that objects, solutions, and advantages of the present disclosure will become apparent.

Figure 1:
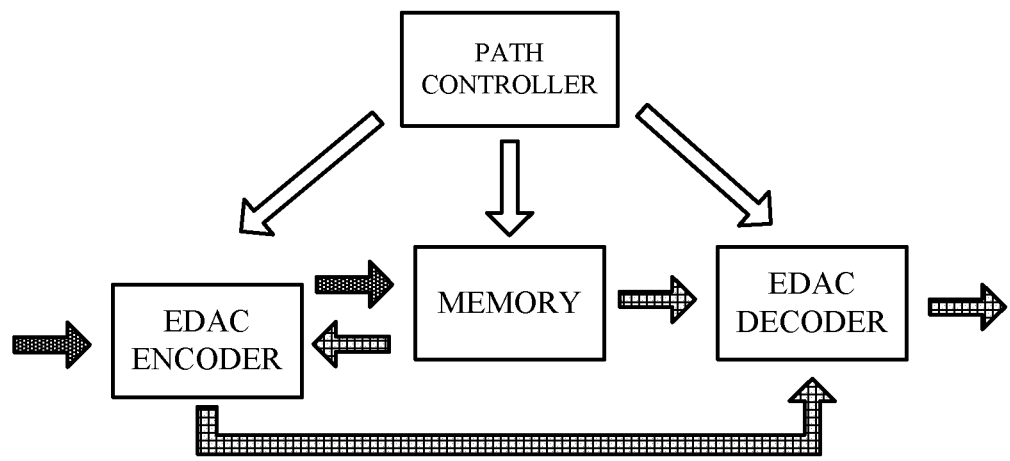
FIG. 1 schematically shows a structural diagram of a device for storing encoded and/or decoded codes according to an embodiment of the present disclosure.

According to an exemplary embodiment of the present disclosure, there is provided a device for storing encoded and/or decoded codes by re-using an encoder. FIG. 1 schematically shows a structural diagram of the device for storing the encoded and/or decoded codes according to the embodiment of the present disclosure. As shown in FIG. 1, the device comprises an error detection and correction (EDAC) encoder, a memory, and an EDAC decoder. In an encoding process, the EDAC encoder is configured to encode N-bit information data received at its input and output M-bit check data, wherein M<N, and the memory is connected with the EDAC encoder and configured to store the N-bit information data and the M-bit check data. In a decoding process, the EDAC encoder is configured to encode the N-bit information data retrieved from the memory and output M-bit check data, and the EDAC decoder is connected with the memory and the EDAC encoder and configured to conduct error correction on the N-bit information data retrieved from the memory based on the M-bit check data output from the EDAC encoder and the M-bit check data retrieved from the memory and output error-corrected N-bit information data. According to this embodiment, the encoder can be re-used during the decoding process, which makes it unnecessary to use additional hardware, thus substantially reducing the area of the decoder.

The device according to an embodiment may also comprise a path controller to control data stream between the EDAC encoder, the EDAC decoder, and the memory. The path controller is connected with the EDAC encoder, the memory, and the EDAC decoder. As shown in FIG. 1, hollow arrows indicate control signals of the path controller for controlling data stream paths between the EDAC encoder, the memory, and the EDAC decoder. Solid arrows indicate data streams in the device during the encoding process. Shadowed arrows indicate data streams in the device during the decoding process. In the encoding process, the path controller switches on a data stream path from the EDAC encoder to the memory and switches off a data stream path from the memory to the EDAC encoder and a data stream path from the memory to the EDAC decoder. In the decoding process, the path controller switches on the data stream path from the memory to the EDAC encoder and the data stream path from the memory to the EDAC decoder and switches off the data stream path from the EDAC encoder to the memory. It should be noted that the connections described in the present disclosure are typically unidirectional connections. For example, in the encoding process, the data stream path switched on by the path controller from the EDAC encoder to the memory is a unidirectional connection from the EDAC encoder to the memory. The connection from the memory to the EDAC decoder is not switched on.

In this embodiment, the memory may have an arbitrary bit number. The bit number M of the check data can be set according to the bit number N of the information data stored in the memory. For example, when the memory is an 8-bit memory, N=8, and M=4. When the memory is a 32-bit memory, N=32, M=7.

Next, the EDAC encoder and the EDAC decoder in the device for storing the encoded and/or decoded codes according to an embodiment of the present disclosure will be explained in detail by taking a 32-bit memory as an example. In this case, the information data and the check data are encoded and decoded using improved HAMMING coding, i.e., HSIAO coding. The HSIAO coding and corresponding check matrix are described in: Reference 1, "A Class of Optimal Minimum Odd-Weight-Column SEC-DED Codes," M. Y. Hsiao, IBM Journal of Research and Development, Vol. 14, No. 4, (1970), pp. 395-401; and Reference 2, "Error Control Coding in Computers," EiJiwara et al., Computer, July 1990. The HSIAO encoding/decoding check matrix (see, FIG. 4 of Reference 1) used in the device for storing the encoding or decoding codes according to the embodiment of the present disclosure is shown as follows. The EDAC encoder shown in FIG. 2, the EDAC decoder shown in FIG. 3, and the secondary decoding circuit of the EDAC decoder shown in FIG. 4 are all associated with this check matrix. The association relationships between respective circuits and the check matrix will be explained before respective circuits are described.

ENCODING/DECODING CHECK MATRIX $$H = \begin{bmatrix} \text{(7 rows} \times \text{39 columns check matrix)} \end{bmatrix}$$

Column headers: 0 1 2 3 4 5 6 7 8 9 10 11 12 13 14 15 16 17 18 19 20 21 22 23 24 25 26 27 28 29 30 31 $C_1$ $C_2$ $C_3$ $C_4$ $C_5$ $C_6$ $C_7$ Row weights: 15, 15, 15, 15, 15, 14, 14

Column weights (bottom):
1 1 1 1 1 1 1 1 2 2 2 2 2 2 2 2 3 3 3 3 3 3 3 3 4 4 4 4 4 4 4 4
6 5 5 3 2 5 4 2 6 5 4 3 5 4 1 4 4 7 2 1 5 2 1 5 1 5 3 3 5 2 1 1
7 7 4 7 7 6 6 5 7 7 7 7 6 6 6 5 5 6 6 6 6 5 5 7 2 7 5 7 6 3 3 7

In the above encoding/decoding check matrix, a 7-bit check data is represented by $C_1$~$C_7$. In the present disclosure, the check data is represented by C<0>~C<6>. Accordingly, $C_1$ in the encoding/decoding check matrix corresponds to C<0> in the present disclosure, and so forth. Thus, $C_1$~$C_7$ in the encoding/decoding check matrix correspond to the check data output from the encoder, and bits 0-31 in the encoding/decoding check matrix correspond to the input information data In<0>~In<31>. For each row in the encoding/decoding check matrix, all data bits indicated by '1' in the matrix are subjected to an XOR operation to generate a corresponding bit of the check data. For example, for the first row in the encoding/decoding check matrix, all bits indicated by '1' in the matrix are subjected to the XOR operation to generate $C_1$. A circuit for this encoding process is shown in FIG. 2.

Figure 2:
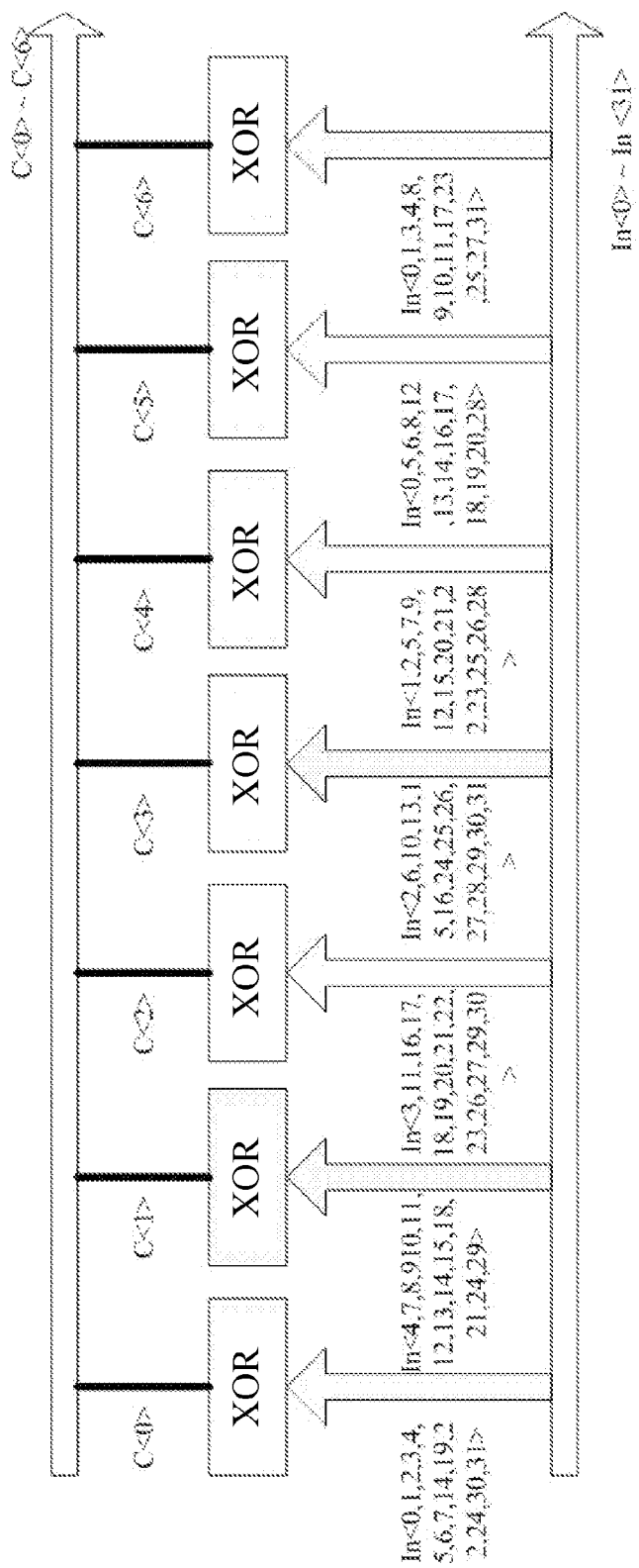
FIG. 2 schematically shows a logic circuit diagram of an EDAC encoder in the device for storing the encoded and/or decoded codes according to an embodiment of the present disclosure.

FIG. 2 schematically shows a logic circuit diagram of an EDAC encoder in the device for storing the encoded and/or decoded codes according to an embodiment of the present disclosure. The circuit is based on a HSIAO coding matrix. As shown in FIG. 2, the EDAC encoder comprises five 14-input XORs and two 13-input XORs. Input information data are represented by In<0>~In<31>. Each of the XORs receives as input a plurality of preset bits of the 32-bit information data (see, e.g., data bits at lower left of each XOR shown in FIG. 3) and outputs the 7-bit check data C<0>~C<6> in sequence. In the encoding process, the EDAC encoder inputs the 32-bit information data and the 7-bit check data into the memory. In the decoding process, the EDAC encoder input the 7-bit check data into the EDAC decoder. According to the circuit shown in FIG. 2, respective bits of the check data are as follows, wherein "^" represents a logical XOR operation:

C<0>=In<0>^In<1>^In<2>^In<3>^In<4>^In<5>^In<6>^In<7>^In<14>^In<19>^In<22>^In<24>^In<30>^In<31>;

C<1>=In<4>^In<7>^In<8>^In<9>^In<10>^In<11>^In<12>^In<13>^In<14>^In<15>^In<18>^In<21>^In<24>^In<29>;

C<2>=In<3>^In<11>^In<16>^In<17>^In<18>^In<19>^In<20>^In<21>^In<22>^In<23>^In<26>^In<27>^In<29>^In<30>;

C<3>=In<2>^In<6>^In<10>^In<13>^In<15>^In<16>^In<24>^In<25>^In<26>^In<27>^In<28>^In<29>^In<30>^In<31>;

C<4>=In<1>^In<2>^In<5>^In<7>^In<9>^In<12>^In<15>^In<20>^In<21>^In<22>^In<23>^In<25>^In<26>^In<28>;

C<5>=In<0>^In<5>^In<6>^In<8>^In<12>^In<13>^In<14>^In<16>^In<17>^In<18>^In<19>^In<20>^In<28>;

C<6>=In<0>^In<1>^In<3>^In<4>^In<8>^In<9>^In<10>^In<11>^In<17>^In<23>^In<25>^In<27>^In<31>.

The decoding process is also based on the encoding/decoding check matrix. First, the encoder is re-used in a way similar to that described above for the encoding process to generate C<0>~C<6>. Then C<0>~C<6> and the 7-bit check data O1<32>~O<38> stored in the memory are subjected to XOR operations, respectively, to generate an error-correction signal C1<0>~C1<6> and an inverse signal thereof C1B<0>~C1B<6>. Then, for each column of the encoding/decoding check matrix, a 7-bit AND operation is conducted to generate a corresponding 32-bit secondary error-correction signal. For example, the secondary error-correction signal for O<n> (0≤n≤31) is generated from 7 bits in the n−1 column of the encoding/decoding check matrix. Numbers 1~7 at the left of the encoding/decoding check matrix correspond to C<0>~C<6>. In the first column, the first, sixth, and seventh row are indicated by '1'. Thus, bits C1<0>, C1<5>, C1<6>, C1B<1>, C1B<2>, C1B<3>, and C1B<4> are subjected to the 7-input AND operation to generate the secondary error-correction signal for O<0>. The secondary error-correction signal for O<0> is then used in error-correction of the information data. The decoding circuit for this process is shown in FIGS. 3 and 4.

Figure 3:
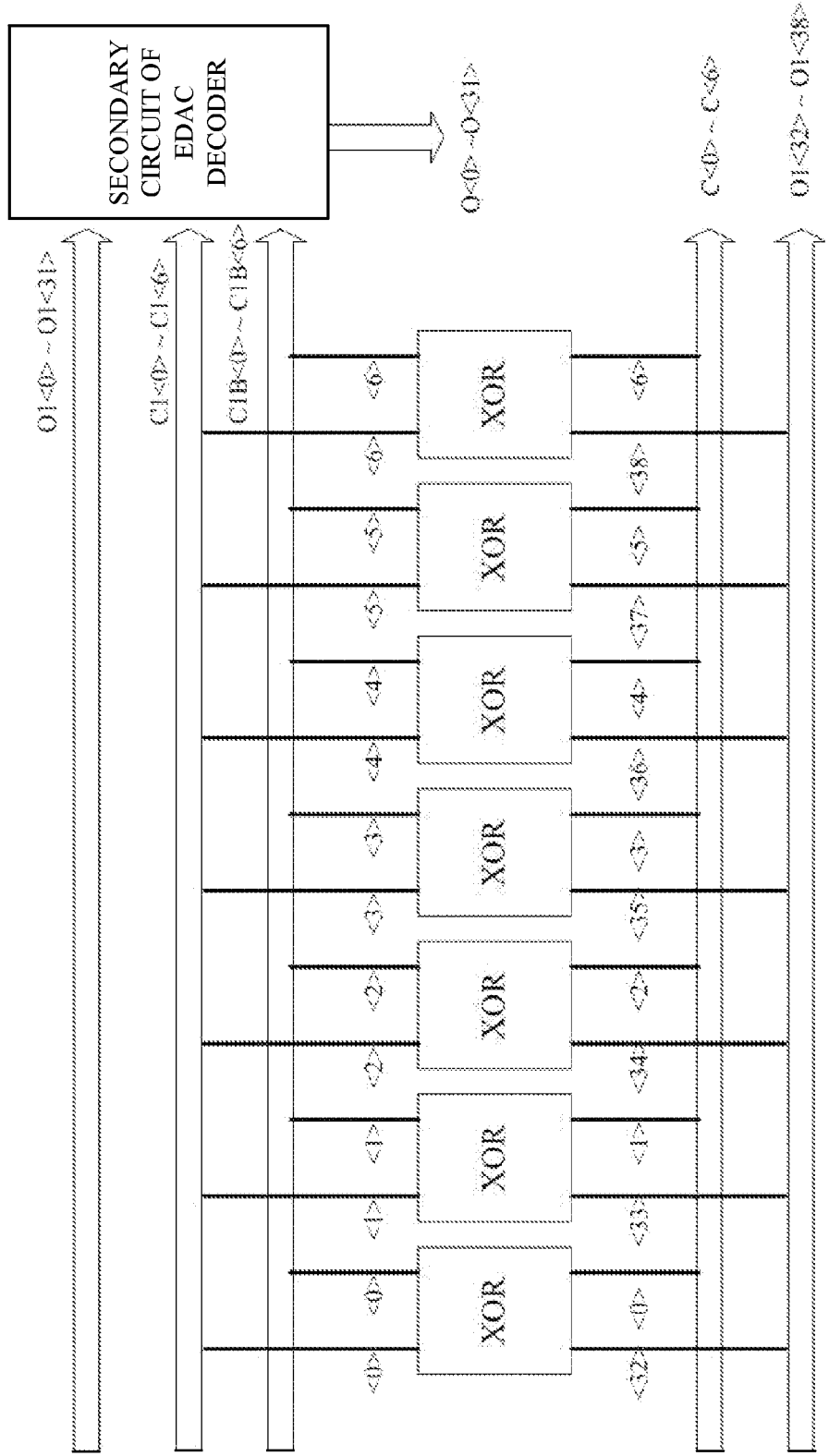
FIG. 3 schematically shows a logic circuit diagram of an EDAC decoder device for storing the encoded and/or decoded codes according to an embodiment of the present disclosure.
Figure 4:
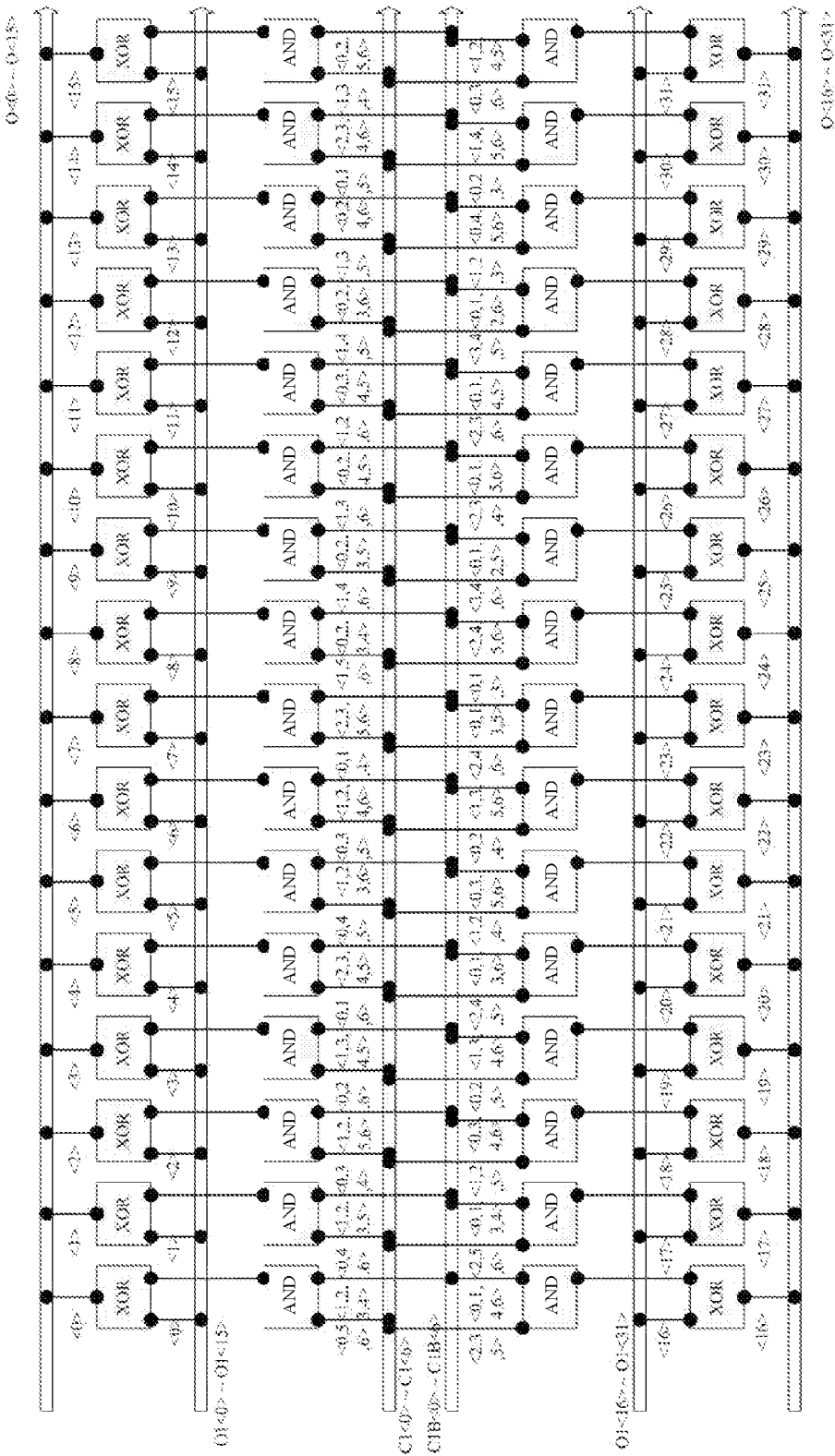
FIG. 4 schematically shows a logic circuit diagram of a secondary decoding circuit of the EDAC decoder device for storing the encoded and/or decoded codes according to an embodiment of the present disclosure.

FIG. 3 schematically shows a logic circuit diagram of an EDAC decoder device for storing the encoded and/or decoded codes according to an embodiment of the present disclosure. As shown in FIG. 3, the EDAC decoder comprises seven 2-input XORs and a secondary circuit of the EDAC decoder. The EDAC decoder operates in two phases, including generating a primary error-correction signal and correcting the information data using the primary error-correction signal.

First, as shown in FIG. 3, the EDAC decoder conducts XOR operations on the 7-bit check data (O1<32>~O<38>) retrieved from the memory and the 7-bit check data (C<0>~C<6>) output from the EDAC encoder in sequence, respectively, to generate a 7-bit primary error-correction signal (C1<0>~C1<6>) and an inverse signal thereof (C1B<0>~C18<6>). If no error occurs, the 7-bit primary error-correction signal will be zero. However, if any soft error occurs, the 7-bit primary error-correction signal will not be zero. The 7-bit primary error-correction signal and the inverse signal thereof are input into the secondary circuit of the EDAC decoder. The inverse signal is represented by "−":

C1<0>=O1<32>^C<0>; C1B<0>=−(O1<32>^C<0>);
C1<1>=O1<33>^C<1>; C1B<1>=−(O1<33>^C<1>);
C1<2>=O1<34>^C<2>; C1B<0>=−(O1<34>^C<2>);
C1<3>=O1<35>^C<3>; C1B<0>=−(O1<35>^C<3>);

C1<4>=O1<36>^C<4>; C1B<0>=~(O1<36>^C<4>);
C1<5>=O1<37>^C<5>; C1B<0>=~(O1<37>^C<5>);
C1<6>=O1<38>^C<6>; C1B<0>=~(O1<38>^C<6>).

FIG. 4 schematically shows a logic circuit diagram of a secondary decoding circuit of the EDAC decoder device for storing the encoded and/or decoded codes according to an embodiment of the present disclosure. As shown in FIG. 4, the secondary decoding circuit comprises thirty-two 7-input ANDs and thirty-two 2-input XORs. The 7-bit error-correction signal (C1<0>~C1<6>) and the inverse signal thereof (C1B<0>~C1B<6>) are subjected to thirty-two AND operations by the 7-input ANDs to generate thirty-two secondary error-correction signals. Then the thirty-two secondary error-correction signals and the 32-bit information data O1<0>~O1<31> are subjected to XOR operations, respectively. If one of the secondary error-correction signals is '0', the corresponding information data bit is correct and its value will not be changed after the XOR operation. If the secondary error-correction signal is '1', the corresponding information data bit is incorrect and its value is corrected after the XOR operation. Finally, a correct 32-bit data can be obtained. In particular:

O<0>=O1<0>^(C1<0> & C1<5> & C1<6> & C1B<1> & C1B<2> & C1B<3> & C1B<4>);
O<1>=O1<1>^(C1<0> & C1<4> & C1<6> & C1B<1> & C1B<2> & C1B<3> & C1B<5>);
O<2>=O1<2>^(C1<0> & C1<3> & C1<4> & C1B<1>. & C1B<2> & C1B<5> & C1B<6>);
O<3>=O1<3>^(C1<0> & C1<2> & C 1<6> & C1B<1> & C1B<3> & C1B<4> & C1B<5>);
O<4>=O1<4>^(C1<0> & C1<1> & C1<6> & C1B<2> & C1B<3> & C1B<4> & C1B<5>):
O<5>=O1<5>^(C1<0> & C1<4> & C1<5> & C1B<1> & C1B<2> & C1B<3> & C1B<6>);
O<6>=O1<6>^(C1<0> & C1<3> & C1<5> & C1B<1> & C1B<2> & C1B<4> & C1B<6>);
O<7>=O1<7>^(C1<0> & C1<1> & C1<4> & C1B<2> & C1B<3> & C1B<5> & C1B<6>);
O<8>=O1<8>^(C1<1> & C1<5> & C1<6> & C1B<0> & C1B<2> & C1B<3> & C1B<4>);
O<9>=O1<9>^(C1<1> & C1<4> & C1<6> & C1B<0> & C1B<2> & C1B<3> & C1B<5>);
O<10>=O1<10>^(C1<1> & C1<3> & C1<6> & C1B<0> & C1B<2> & C1B<4> & C1B 5>);
O<11>=O1<11>^(C1<1> & C 1<2> & C1<6> & C1B<0> & C1B<3> & C1B<4> & C1B<5>);
O<12>=O1<12>^(C1<1> & C1<4> & C1<5> & C1B<0> & C1B<2> & C1B<3> & C 1B<6>);
O<13>=O1<13>^(C1<1> &C1<3> & C1<5> & C1B<0> & C1B<2> & C1B<4> & C1B<6>);
O<14>=O01<14>^(C1<0> & C1<1> & C1<5> & C 1B<2> & C1B<3> & C1B<4> & C1B<6>);
O<15>=O1<15>^(C1<1> & C1<3> & C1<4> & C1B<0> & C1B<2> & C1B<S> & C1B<6>);
O<16>=O1<16>^(C1<2> & C1<3> & C1<5> & C1B<0> & C1B<1> & C1B<4> & C1B<6>);
O<17>=O1<17>^(C1<2> & C1<5 & C1<6> & C1B<0> & C1B<1> & C1B<3> & C1B<4>);
O<18>=O1<18>^(C1<1> &C1<2> & C<5> & C1B<0> & C1B<3> & C1B<4> & C1B<6>);
O<19>=O1<19>^(C1<0> & C1<2> & C1<5> & C1B<1> & C1B<3> & C1B<4> & C1B<6>);
O<20>=O1<20>^(C1<2> & C1<4> & C1<5> & C1B<0> & C1B<1> & C1B<3> & C1B<6>);
O<21>=O1<21>^(C1<1> & C1<2> & C1<4> & C1B<0> & C1B<3> & C1B<5> & C1B<6>);
O<22>=O1<22>^(C1<0> & C<2> & C1<4> & C1B<1> & C1B<3> & C1B<5> & C1B<6>);
O<23>=O1<23>^(C1<2> & C1<4> & C<6> & C1B<0> & C1B<1> & C1B<3> & C1B<5>);
O<24>=O1<24>^(C1<0> & C1<1> & C1<3> & C1B<2> & C1B<4> & C1B<5> & C1B<6>);
O<25>=O1<25>^(C1<3> & C1<4> & C1<6> & C1B<0> & C1B<1> & C1B<2> & C1B<5>);
O<26>=O1<26>^(C1<2> & C1<3> & C1<4> & C1B<0> &C1B<1> & C1B<5> & C1B<6>);
O<27>=O1<27>^(C1<2> & C1<3> & C1<6> & C1B<0> & C1B<1> & C1B<4> & C1B<5>);
O<28>=O1<28>^(C1<3> & C1<4> & C1<5> & C1B<0> & C1B<1> & C1B<2> & C1B<6>);
O<29>=O1<29>^(C1<1> & C1<2> & C1<3> & C1B<0> & C1B<4> & C1B<5> & C1B<6>);
O<30>=O1<30>^(C1<0> & C1<2> & C1<3> & C1B<1> & C1B<4> & C1B<5> & C1B<6>);
O<31>=O1<31>^(C1<0> & C1<3> & C1<6> & C1B<1> & C1B<2> & C1B<4> & C1B<5>).

In the foregoing equations, "&" represents a logic AND operation. It should be noted that the present disclosure is particularly suitable for correcting 1-bit error where only one secondary error-correction signal is '1'. The error may not be corrected if two or more secondary error-correction signals are '1'.

According to another aspect of the present disclosure, there is provided a method for storing encoded and/or decoded codes by re-using an encoder. The method comprises, in an encoding process: encoding, by an EDAC encoder, N-bit information data received at its input and outputting M-bit check data, wherein M<N; and storing the N-bit information data and the M-bit check data in the memory connected with the EDAC encoder. The method further comprises, in a decoding process: encoding, by the EDAC encoder, the N-bit information data retrieved from the memory and outputting M-bit check data; and conducting, by the EDAC decoder, error correction on the N-bit information data retrieved from the memory based on the M-bit check data output from the EDAC encoder and the M-bit check data retrieved from the memory and outputting error-corrected N-bit information data.

Optionally, the method may also use a path controller for controlling data paths. The path controller is connected with the EDAC encoder, the memory, and the EDAC decoder. In the encoding process, the path controller switches on a data stream path from the EDAC encoder to the memory and switches off a data stream path from the memory to the EDAC encoder and a data stream path from the memory to the EDAC decoder. In the decoding process, the path controller switches on the data stream path from the memory to the EDAC encoder and the data stream path from the memory to the EDAC decoder and switches off the data stream path from the EDAC encoder to the memory. The method according to the present disclosure has advantages similar to those of the above-described device and thus detailed description is omitted.

According to the device and method of the present disclosure, the encoder can be re-used during the decoding process, which makes it unnecessary to use additional hardware, thus substantially reducing the area of the decoder. Also, according to the device and method of the present disclosure, the anti-SEU ability of the memory can be effectively improved by employing one-bit error-correction and two-bit error-detection. When a single bit in a byte is upset, the error can be detected and corrected. When two bits in the byte are upset, the error can be detected and partly corrected.

The objects, solutions, and advantages of the present disclosure have been described in detail in connection with the foregoing specific embodiments. It should be noted that the foregoing only illustrates exemplary embodiments of the present disclosure. However, the scope of the present disclosure is not limited thereto. Any modification, substitution, or improvement will fall within the scope of the present disclosure without departing from the spirit and principle thereof.

We claim:

1. A device for storing encoded and/or decoded codes by re-using an encoder, the device comprising an error detection and correction (EDAC) encoder, a memory, and an EDAC decoder, wherein:
in an encoding process:
the EDAC encoder is configured to encode N-bit information data received at its input and output M-bit check data, wherein M<N; and
the memory is connected with the EDAC encoder and configured to store the N-bit information data and the M-bit check data; and
in a decoding process:
the EDAC encoder is configured to encode the N-bit information data retrieved from the memory and output M-bit check data; and
the EDAC decoder is connected with the memory and the EDAC encoder and configured to conduct error correction on the N-bit information data retrieved from the memory based on the M-bit check data output from the EDAC encoder and the M-bit check data retrieved from the memory and output error-corrected N-bit information data.

2. The device according to claim 1, further comprising a path controller connected with the EDAC encoder, the memory, and the EDAC decoder, wherein:
in the encoding process:
the path controller switches on a data stream path from the EDAC encoder to the memory and switches off a data stream path from the memory to the EDAC encoder and a data stream path from the memory to the EDAC decoder; and
in the decoding process:
the path controller switches on the data stream path from the memory to the EDAC encoder and the data stream path from the memory to the EDAC decoder and switches off the data stream path from the EDAC encoder to the memory.

3. The device according to claim 1, wherein the memory is an 8-bit memory or a 32-bit memory, wherein:
N=8 and M=4 when the memory is the 8-bit memory; and
N=32 and M=7 when the memory is the 32-bit memory.

4. The device according to claim 3, wherein when the memory is the 32-bit memory:
the EDAC encoder is configured to encode 32-bit information data using an encoding/decoding check matrix of HSIAO coding and output 7-bit check data; and
the EDAC decoder is configured to conduct error correction on the 32-bit information data retrieved from the memory based on the 7-bit check data output from the EDAC decoder and the 7-bit check data retrieved from the memory using the encoding/decoding check matrix of the HSIAO coding.

5. The device according to claim 4, wherein:
the EDAC encoder comprises five 14-input XORs and two 13-input XORs; and
each of the XORs is configured to receive and conduct an XOR operation on preset bits of the 32-bit information data and output 1-bit check data.

6. The device according to claim 5, wherein:
the EDAC decoder comprises seven 2-input XORs, thirty-two 7-input ANDs, and thirty-two 2-input XORs;
the seven 2-input XORs are configured to conduct XOR operations on the 7-bit check data retrieved from the memory and the corresponding 7-bit check data output from the EDAC decoder, respectively, and output a 7-bit primary error-correction signal and an inverse signal thereof;
the thirty-two 7-input ANDs are connected with the seven 2-input XORs and configured to conduct thirty-two AND operations on the 7-bit primary error-correction signal and the inverse signal thereof, respectively, to generate thirty-two secondary error-correction signals; and
the thirty-two 2-input XORs are connected with the thirty-two 7-input ANDs and configured to perform error detection and correction on the 32-bit information data retrieved from the memory by conducting XOR operations on the thirty-two secondary error-correction signals and the 32-bit information data retrieved from the memory and output 32-bit error-corrected information data.

7. A method applied to the device according to claim 1 for storing the encoded and/or decoded codes by re-using the encoder, comprising:
in the encoding process:
encoding, by the EDAC encoder, the N-bit information data received at its input and outputting the M-bit check data, wherein M<N; and
storing the N-bit information data and the M-bit check data in the memory connected with the EDAC encoder; and
in the decoding process:
encoding, by the EDAC encoder, the N-bit information data retrieved from the memory and outputting M-bit check data; and
conducting, by the EDAC decoder, the error correction on the N-bit information data retrieved from the memory based on the M-bit check data output from the EDAC encoder and the M-bit check data retrieved from the memory and outputting the error-corrected N-bit information data.

8. The method according to claim 7, further comprising:
in the encoding process:
switching on a data stream path from the EDAC encoder to the memory and switching off a data stream path from the memory to the EDAC encoder and a data stream path from the memory to the EDAC decoder by a path controller; and
in the decoding process:
switching on the data stream path from the memory to the EDAC encoder and the data stream path from the memory to the EDAC decoder and switching off the data stream path from the EDAC encoder to the memory by the path controller.

9. The method according to claim 8, wherein the memory is an 8-bit memory or a 32-bit memory, wherein:
N=8 and M=4 when the memory is the 8-bit memory; and
N=32 and M=7 when the memory is the 32-bit memory.

10. The method according to claim 9, wherein when the memory is the 32-bit memory:
the encoding, by the EDAC encoder, the N-bit information data received at its input and outputting the M-bit check data comprises encoding, by the EDAC encoder, 32-bit information data using HSIAO coding and outputting 7-bit check data; and the conducting, by the EDAC encoder, the error correction on the N-bit information data retrieved from the memory based on the M-bit check data output from the EDAC encoder and the M-bit check data retrieved from the memory comprises conducting, by the EDAC decoder, the error correction on the 32-bit information data retrieved from the memory based on the 7-bit check data output from the EDAC decoder and 7-bit check data retrieved from the memory using a encoding/decoding check matrix of the HSIAO coding to generate error-corrected 32-bit information data.

* * * * *